(12) United States Patent
Sanada et al.

(10) Patent No.: US 9,051,662 B2
(45) Date of Patent: Jun. 9, 2015

(54) SINGLE CRYSTAL, PRODUCTION PROCESS OF SAME, OPTICAL ISOLATOR, AND OPTICAL PROCESSOR USING SAME

(75) Inventors: Kazuo Sanada, Chiba (JP); Kiyoshi Shimamura, Tsukuba (JP); Villora Encarnacion Antonia Garcia, Tsukuba (JP)

(73) Assignees: FUJIKURA LTD., Tokyo (JP); NATIONAL INSTITUTE FOR MATERIALS SCIENCE, Ibaraki (JP)

( * ) Notice: Subject to any disclaimer, the term of this patent is extended or adjusted under 35 U.S.C. 154(b) by 131 days.

(21) Appl. No.: 13/451,953

(22) Filed: Apr. 20, 2012

(65) Prior Publication Data

US 2012/0200920 A1 Aug. 9, 2012

Related U.S. Application Data

(63) Continuation of application No. PCT/JP2010/068422, filed on Oct. 20, 2010.

(30) Foreign Application Priority Data

Oct. 21, 2009 (JP) ................................. 2009-242433

(51) Int. Cl.
 *G02B 27/28* (2006.01)
 *C30B 29/28* (2006.01)
 *G02F 1/09* (2006.01)
 *C30B 15/00* (2006.01)

(52) U.S. Cl.
 CPC . *C30B 29/28* (2013.01); *G02F 1/09* (2013.01); *C30B 15/00* (2013.01)

(58) Field of Classification Search
None
See application file for complete search history.

(56) References Cited

U.S. PATENT DOCUMENTS

| 5,113,472 | A | 5/1992 | Gualtieri et al. |
|---|---|---|---|
| 5,175,787 | A | 12/1992 | Gualtieri et al. |
| 5,245,689 | A | 9/1993 | Gualtieri |
| 2003/0075706 | A1 | 4/2003 | Shiang et al. |
| 2003/0127630 | A1 | 7/2003 | Vartuli et al. |
| 2004/0084655 | A1 | 5/2004 | Vartuli et al. |
| 2004/0218712 | A1 | 11/2004 | Jiang et al. |
| 2007/0187645 | A1 | 8/2007 | Lyons et al. |

FOREIGN PATENT DOCUMENTS

| CN | 1629251 A | 6/2005 |
|---|---|---|
| CN | 1995274 A | 7/2007 |

(Continued)

OTHER PUBLICATIONS

Canadian Office Action issued Feb. 26, 2014 in Canadian Patent Application No. 2,778,173.

(Continued)

*Primary Examiner* — Derek S Chapel
(74) *Attorney, Agent, or Firm* — Sughrue Mion, PLLC

(57) ABSTRACT

The present invention provides a single crystal for an optical isolator having a Faraday rotation angle exceeding that of TGG single crystal in a wavelength region of 1064 nm or longer or in a wavelength region of shorter than 1064 nm, and is capable of realizing enlargement of crystal size, a production process thereof, an optical isolator, and an optical processor that uses the optical isolator. The single crystal according to the present invention is composed of a terbium aluminum garnet single crystal, and mainly a portion of the aluminum is replaced with lutetium.

11 Claims, 9 Drawing Sheets

(56) References Cited

FOREIGN PATENT DOCUMENTS

| | | |
|---|---|---|
| DE | 33 42 205 A1 | 5/1985 |
| DE | 10 2004 051 519 A1 | 5/2005 |
| EP | 0 586 542 A1 | 3/1994 |
| EP | 0662698 A1 | 7/1995 |
| EP | 1544328 A1 | 9/2003 |
| JP | 6-507986 A | 9/1994 |
| JP | 7-89797 A | 4/1995 |
| JP | 2001-226196 A | 8/2001 |
| JP | 2002-293693 A | 10/2002 |
| JP | 2004333489 A | 11/2004 |
| JP | 2005-126718 A | 5/2005 |
| JP | 2007-169647 A | 7/2007 |
| JP | 2008-013607 | 1/2008 |
| NL | 1027265 C | 4/2005 |
| NL | 1033061 C | 6/2007 |
| WO | 92/21996 A1 | 12/1992 |

OTHER PUBLICATIONS

International Search Report for PCT/JP2010/068422 dated Nov. 16, 2010.

Valery I. Chani et al., "Melt Growth of $(Tb,Lu)_3Al_5O_{12}$ mixed garnet fiber crystals", Journal of Crystal Growth, 2000, pp. 469-475, vol. 212, No. 10.

D.M. Gualtieri, "Magneto-optical waveguides of aluminum garnet", Journal of Applied Physics, 1993, pp. 5626-5628, vol. 73, No. 10.

D.M. Gualtieri et al., "Epitaxial waveguides of aluminum garnet", Journal of Applied Physics, 1993, pp. 20-24, vol. 74, No. 1.

Wenjing Zhang et al., "Growth and characterization of $Tb_3Ga_{5-x}Al_xO_{12}$ single crystal", Journal of Crystal Growth, 2007, pp. 195-199, vol. 306.

S. Ganschow et al., "On the Crystallization of Terbium Aluminum Garnet", Crystal Research and Technology, 1999, pp. 615-619, vol. 34.

Chinese Office Action issued Dec. 25, 2013 is Chinese Patent Application No. 201080046622.8.

Yoshikawa, A. et al., "Czochraiski growth of Tb3Sc2Al3O12 single crystal for Faraday rotator", Materials Research Bulletin, Oct. 2001.

Japanese Office Action issued Oct. 15, 2013 in Japanese Patent Application No. 2011-537270.

Extended European Search Report dated Jul. 31, 2013, issued in European Patent Application No. 10824951.7.

Japanese Office Action issued Sep. 16, 2014 in Japanese Patent Application No. 2014-003917.

F I G. 3
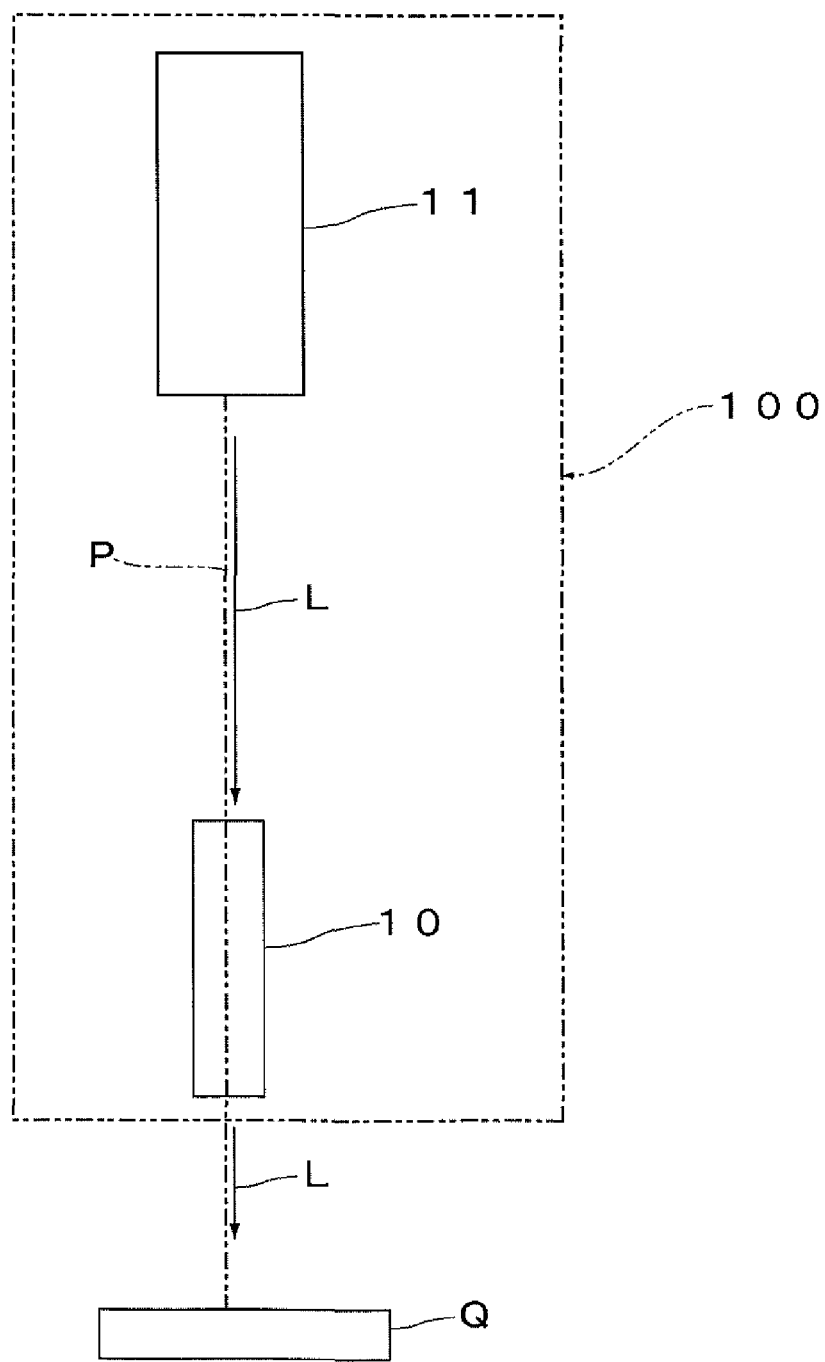

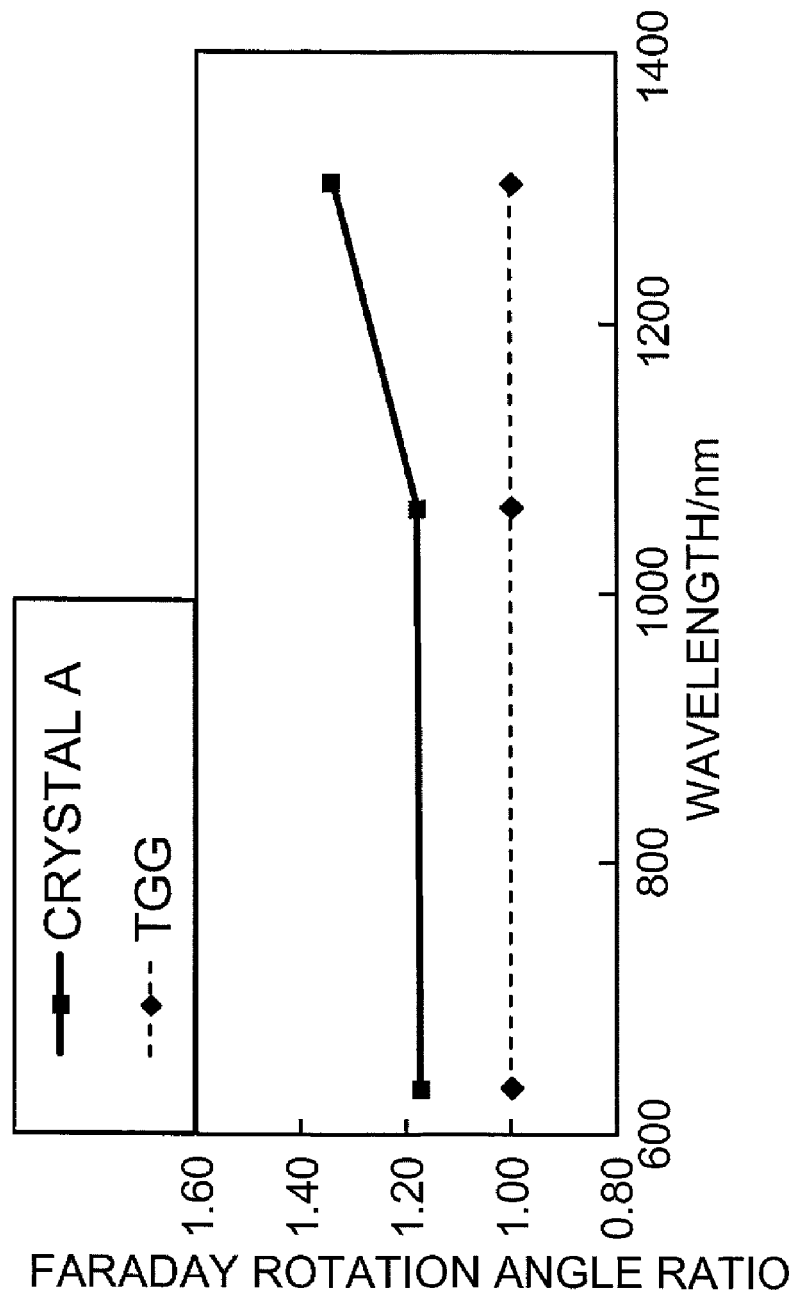
F I G. 4

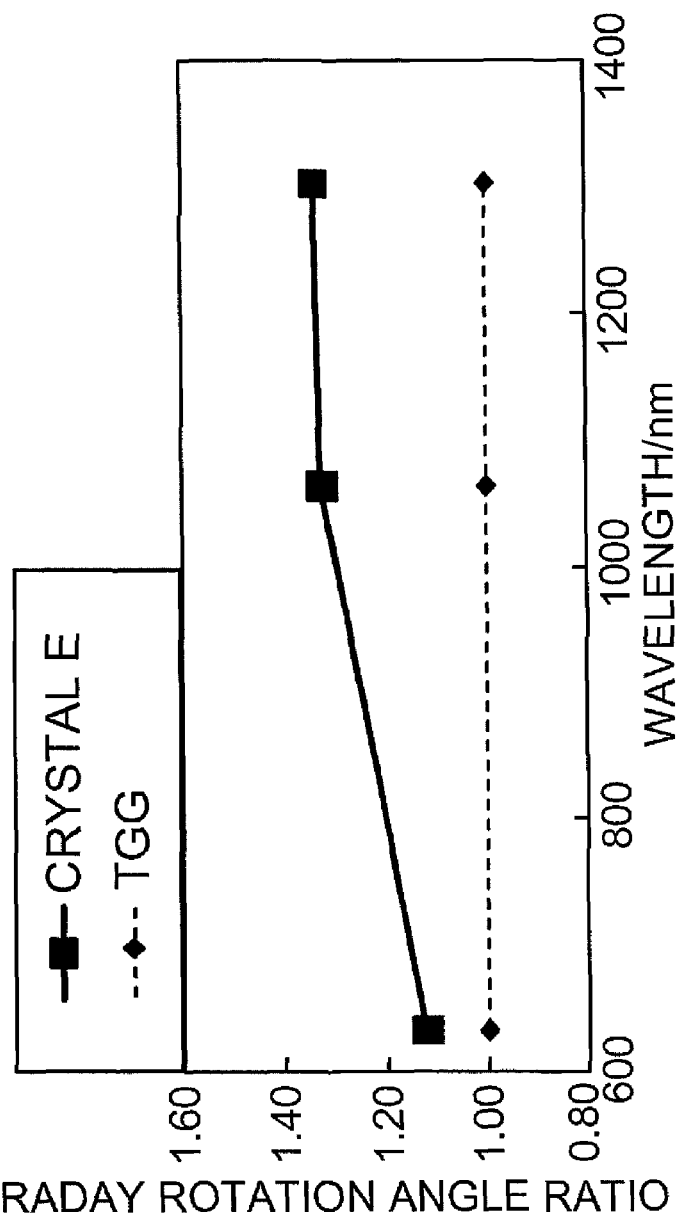
F I G. 6

SINGLE CRYSTAL, PRODUCTION PROCESS OF SAME, OPTICAL ISOLATOR, AND OPTICAL PROCESSOR USING SAME

CROSS REFERENCE TO RELATED APPLICATIONS

This application is a Continuation of National Stage of International Application No. PCT/JP2010/068422 filed Oct. 20, 2010, claiming priority based on Japanese Patent Application No. 2009-242433 filed Oct. 21, 2009, the contents of all of which are incorporated herein by reference in their entirety.

TECHNICAL FIELD

The present invention relates to a single crystal preferable for use as a Faraday rotator, a production process thereof, an optical isolator and an optical processor using that optical isolator.

BACKGROUND ART

Although optical isolators have conventionally been used for optical communications, due to advancements in the field of optical processors in recent years, optical processors have also come to require optical isolators. The wavelength required to be accommodated at that time is mainly the wavelength of 1064 nm of Nd:YAG lasers. Terbium gallium garnet (TGG: $Tb_3Ga_5O_{12}$) single crystals have recently been developed and used practically as materials suitable for this wavelength (Non-Patent Document 1).

However, it is difficult to increase the size of TGG crystals due to the violent evaporation of gallium oxide, which is a raw material component thereof, and this has prevented the cost of these crystals from being able to be reduced. For this reason, the development of a material that has a larger Faraday rotation angle (Verdet constant) than TGG and can be produced at low cost has been sought (Non-Patent Document 1).

In order to solve the above-mentioned problem of TGG, development has proceeded on the growth of terbium aluminum-based garnet (TAG: $Tb_3Al_5O_{12}$) single crystals. A known method used to grow TAG involves a production process using a melt growth method (LPE method) in which a substrate crystal is placed in a supercooled melt inside a crucible and crystals are grown on the surface thereof in the form of a film (Non-Patent Document 2).

In addition, research is also being conducted on terbium scandium aluminum garnet (TSAG: $Tb_3Sc_2Al_3O_{12}$) single crystals, and TSAG single crystals have been reported to be superior with respect to enlargement of crystal size (Patent Document 1).

PRIOR ART DOCUMENTS

Patent Documents

Patent Document 1: Japanese Patent Application Laid-open No. 2002-293693

Non Patent Documents

Non-Patent Document 1: Journal of Crystal Growth, 306 (2007), 195-199
Non-Patent Document 2: Cryst. Res. Technol., 34 (1999), 5-6, p 615-619

SUMMARY OF THE INVENTION

Problem to be Solved by the Invention

However, although the TAG described in Non-Patent Document 2 is superior to TGG as a result of having a larger Verdet constant than TGG, it has not come to be used practically due to the difficulty of enlarging crystal size as a result of having an incongruent melt composition (Non-Patent Document 1).

In addition, although the TSAG described in Patent Document 1 has a larger Verdet constant than TGG and enables the growth of larger single crystal in comparison with TAG, it is still difficult to enlarge the single crystal size in comparison with TGG.

Thus, only TGG is currently used on the market at the present time.

The present invention is contrived in consideration of the above-described situations, and an object of the present invention is to provide a single crystal having a Faraday rotation angle exceeding that of TGG single crystal while also being able to realize adequate enlargement of the crystal size, a production process thereof, an optical isolator and an optical processor that uses the optical isolator.

Means for Solving the Problem

The single crystal of the present invention is composed of a terbium aluminum garnet single crystal and mainly a portion of the aluminum (Al) is replaced with lutetium (Lu).

Here, the term "mainly" means that a portion of the Al is always replaced with Lu, while whether or not Tb is replaced with Lu is arbitrary.

This single crystal has a Faraday rotation angle exceeding that of TGG single crystal in the wavelength region of 1064 nm or longer or the wavelength region of shorter than 1064 nm, and is capable of realizing adequate enlargement of crystal size. Moreover, unlike TGG single crystal, this single crystal is able to adequately inhibit decreases in transmittance particularly in the short wavelength region (400 nm to 700 nm).

Normally, the above-mentioned single crystal is represented by the following chemical formula (I):

$$(Tb_{a-y}L_y)(M_{b-x}N_x)Al_{3-z}O_{12} \qquad (I)$$

(wherein, L represents M or N, M represents at least one type of element selected from the group consisting of Sc and Y, N contains Lu, and a and b satisfy the following formulas:

$2.8 \leq a \leq 3.2$; and $1.8 \leq b \leq 2.2$).

In chemical formula (I) above, N is preferably Lu.
In chemical formula (I) above, N may further contain at least one type of element selected from the group consisting of Yb and Tm.
In chemical formula (I) above, M is preferably Sc, N is preferably Lu and x preferably satisfies the following formula:

$0.01 \leq x \leq 0.6$.

If x is within the above range, the effect of replacement with Lu is obtained more adequately as compared with the case of x being less than 0.01, and the melting point can be lowered as compared with the case of x being greater than 0.6, thereby facilitating growth.

In addition, y and z in chemical formula (I) above preferably satisfy the following formulas:

$0 \leq y \leq 0.5$; and $-0.5 \leq z \leq 0.5$.

Here, y and z in chemical formula (I) above more preferably satisfy the following formulas:

$0 \leq y \leq 0.2$; and $-0.2 \leq z \leq 0.2$.

Here, y is more preferably 0. In this case, decreases in the Verdet constant are more adequately inhibited as compared with the case of y not being 0.

In addition, the present invention is also a production process of a single crystal comprising heating and melting a powdered raw material containing terbium oxide, aluminum oxide and lutetium oxide, and obtaining the single crystal described above from a resulting melt by a melt growth method.

In addition, the present invention is an optical isolator that has the above-mentioned single crystal. This optical isolator has the above-mentioned single crystal, and as was previously described, the single crystal is able to provide a Faraday rotation angle exceeding that of TGG single crystal in a wavelength region of 1064 nm or longer as well as a short wavelength region (400 nm to 700 nm). Consequently, the optical isolator of the present invention can be used as an optical isolator of optical processors provided with laser light sources of various emission wavelengths, and has extremely high versatility.

Moreover, the present invention is an optical processor provided with a laser light source and an optical isolator arranged in a light path of laser light emitted from the laser light source, and the optical isolator is the above-mentioned optical isolator.

According to this optical processor, the use of a single crystal composed of a terbium aluminum garnet single crystal in which mainly a portion of the Al is replaced with Lu makes it possible to increase the Faraday rotation angle beyond that of TGG. Consequently, the size of an optical isolator can be reduced as compared with the case of using TGG. As a result, an optical processor can be reduced in size than in the case of using TGG for the optical isolator.

Here, the emission wavelength of the laser light source is preferably 1064 nm.

Alternatively, the emission wavelength of the laser light source may also be within the range of 400 nm to 700 nm. The above-mentioned single crystal has a Faraday rotation angle exceeding that of TGG single crystal even if the emission wavelength of the laser light source is in the short wavelength region (400 nm to 700 nm), and is able to adequately inhibit decreases in transmittance. Consequently, decreases in output caused by an optical isolator are adequately prevented even if the emission wavelength of the laser light source in the optical processor is within the range of 400 nm to 700 nm.

Effects of the Invention

As a result of having mainly replaced a portion of Al with Lu in a terbium aluminum garnet single crystal, the single crystal of the present invention is able to realize a Faraday rotation angle exceeding that of TGG not only in a wavelength region of 1064 nm or longer, but also in a wavelength region of shorter than 1064 nm. For this reason, a single crystal that is preferable for an optical isolator of an optical processor using, for example, an Nd:YAG laser is realized by the present invention. In addition, the single crystal of the present invention is also able to realize increased size. Moreover, the single crystal of the present invention is able to adequately inhibit decreases in transmittance in a short wavelength region (400 nm to 700 nm), unlike TGG single crystal.

According to the single crystal production process of the present invention, a terbium aluminum-based garnet single crystal, which is composed of a terbium aluminum garnet single crystal and in which mainly a portion of the Al is replaced with Lu, can be grown easily. For this reason, the production process according to the present invention can contribute to mass production of single crystals.

BRIEF DESCRIPTION OF THE DRAWINGS

FIG. 3 is a schematic diagram showing one embodiment of an optical processor that uses the single crystal according to the present invention;

FIG. 4 is a graph indicating the relationship between the ratio of the Faraday rotation angle of a single crystal of Example 1 (Crystal A) to that of TGG and wavelength;

FIG. 6 is a graph indicating the relationship between the ratio of the Faraday rotation angle of a single crystal of Example 3 (Crystal E) to that of TGG and wavelength;

MODE FOR CARRYING OUT THE INVENTION

The following provides a detailed explanation of embodiments of the present invention with reference to the drawings.

Figure 1:
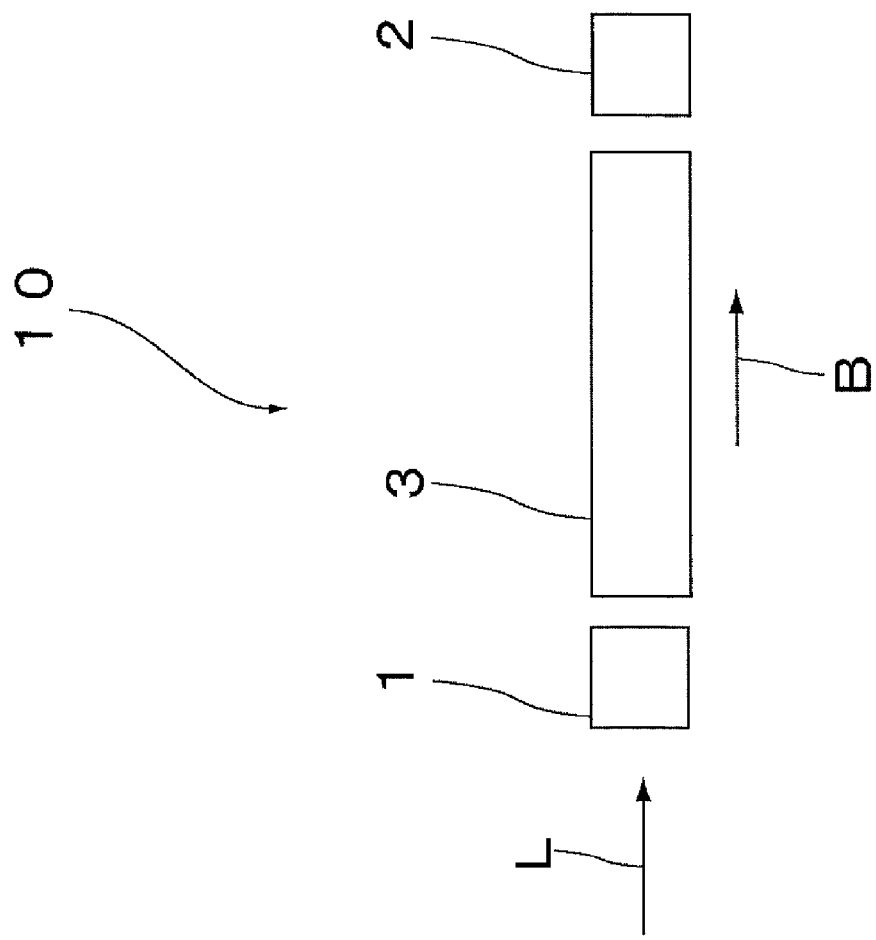
FIG. 1 is a schematic diagram showing one embodiment of an optical isolator that uses the single crystal according to the present invention.

FIG. 1 is a schematic diagram showing one embodiment of an optical isolator of the present invention. As shown in FIG. 1, an optical isolator 10 is provided with a polarizer 1, an analyzer 2 and a Faraday rotator 3 arranged between the polarizer 1 and the analyzer 2. Here, the polarizer 1 and the analyzer 2 are arranged at an angle of 45°, for example, so that their mutual transmission axes are not parallel.

A magnetic flux density B is applied to the Faraday rotator 3 along, for example, a direction from the polarizer 1 to the analyzer 2, or in other words, along the incident direction of a light L, and the Faraday rotator 3 rotates the plane of polarization of the light L that has passed through the polarizer 1 as a result of applying the magnetic flux density B, and causes the light L to pass through the transmission axis of the analyzer 2.

The following provides a detailed explanation of the Faraday rotator 3.

The Faraday rotator 3 is composed of a terbium aluminum garnet single crystal, and is composed of a single crystal in which mainly a portion of the Al is replaced with Lu.

This single crystal has a Faraday rotation angle exceeding that of TGG single crystal at a wavelength of 1064 nm or in a wavelength region longer than a wavelength of 1064 nm, and is capable of realizing adequate size enlargement. Moreover, this single crystal has a Faraday rotation angle exceeding that of TGG single crystal even in a short wavelength region (400 nm to 700 nm), and is able to adequately inhibit decreases in transmittance. In this manner, according to the single crystal of the present invention, a Faraday rotation angle can be obtained that is higher than that of TGG over a wide range of wavelengths. Thus, the single crystal of the present invention has extremely high versatility.

Here, a portion of the Al may or may not be replaced with an element other than Al and Lu. In the case a portion of the Al is replaced with an element other than Al and Lu, examples of elements other than Al and Lu include Sc, Y, Tm and Yb.

The single crystal described above is normally represented by the following chemical formula (I):

(wherein, L represents M or N, M represents at least one type of element selected from the group consisting of Sc and Y, and N contains Lu). In the above formula, although a is normally 3, it can vary within the range of 2.8 to 3.2 due to the occurrence of defects and the like. In addition, although b is normally 2, it can vary within the range of 1.8 to 2.2 due to the occurrence of defects and the like.

In the chemical formula (I) above, N contains Lu. Accordingly, N may be composed of Lu only, or may further contain an element composed of Yb and/or Tm in addition to Lu.

In the chemical formula (I) above, it is preferable that M is Sc, N is Lu, and x satisfies the following formula:

$$0.01 \leq x \leq 0.6.$$

In this case, if x is within the above-mentioned range, the effect of Lu replacement is more adequately obtained as compared with the case of x being less than 0.01, and the melting point can be lowered as compared with the case of x being greater than 0.6, thereby facilitating growth.

Here, x particularly preferably satisfies the following formula:

$$0.05 \leq x \leq 0.2.$$

In addition, in the chemical formula (I) above, y and z preferably satisfy the following formulas:

$$0 \leq y \leq 0.5; \text{ and}$$

$$-0.5 \leq z \leq 0.5.$$

In this case, internal strain in crystal can be held to a low level as compared with the case of y and z being outside these ranges.

Here, y and z in the chemical formula (I) more preferably satisfy the following formulas:

$$0 \leq y \leq 0.2; \text{ and}$$

$$-0.2 \leq z \leq 0.2.$$

Here, y is preferably as small as possible and is most preferably 0. Namely, Tb is preferably not replaced with an element other than Tb. In this case, decreases in the Verdet constant can be adequately inhibited in comparison with the case in which y is not 0, namely in the case Tb is not replaced with an element other than Tb. In addition, z is most preferably 0.

Next, an explanation is provided of a process for producing the Faraday rotator 3.

Figure 2:
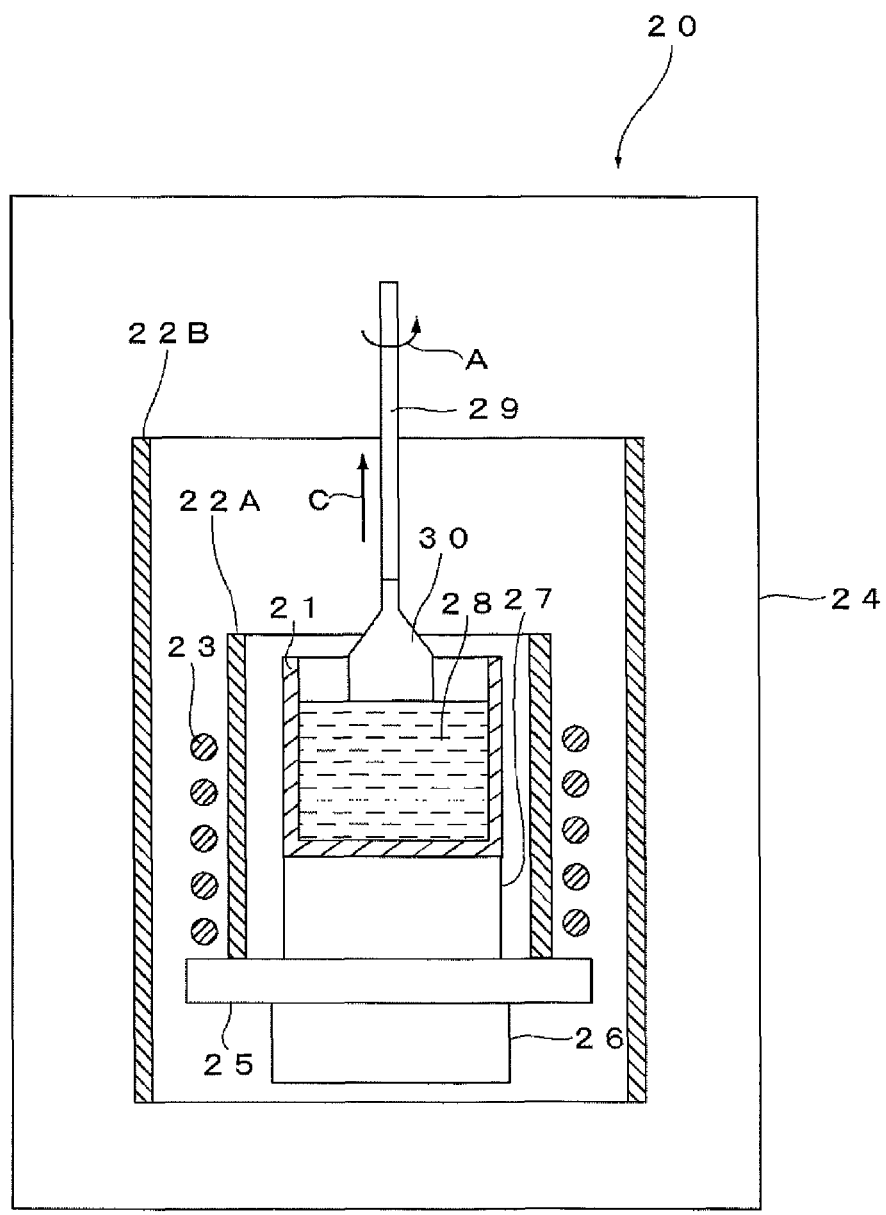
FIG. 2 is a drawing showing a process for growing the single crystal according to the present invention using a crystal pulling oven.

First, an explanation is provided of a crystal pulling oven for growing the garnet single crystal that composes the Faraday rotator 3 with reference to FIG. 2. FIG. 2 is a drawing showing a process for growing the garnet single crystal using a crystal pulling oven.

As shown in FIG. 2, a crystal pulling oven 20 is mainly provided with an iridium crucible 21, a ceramic inner heat insulating material 22A that houses the crucible 21, an outer heat insulating material 22B provided so as to surround the inner heat insulating material 22A and high-frequency coil 23 provided between the inner heat insulating material 22A and the outer heat insulating material 22B, within a sealed housing 24. The high-frequency coil 23 heats the crucible 21 by generating an induction current therein. In addition, the crystal pulling oven 20 is also provided with a mounting platform 25 for mounting the inner heat insulating material 22A, and a support 26 for supporting the mounting platform 25, and the crucible 21 is arranged on the mounting platform 25 via a position adjustment platform 27 for adjusting the position of the crucible 21. Furthermore, in FIG. 2, reference numeral 29 indicates a seed crystal, arrow A indicates the direction of rotation of the seed crystal 29, namely the direction of rotation of a grown crystal 30, and arrow C indicates the pulling direction of the grown crystal 30.

Next, an explanation is provided of a process for growing the above-mentioned single crystal using the crystal pulling oven 20 described above.

First, a powdered raw material is prepared that contains $Tb_4O_7$ powder, $Al_2O_3$ powder and $Lu_2O_3$ powder. At this time, the powdered raw material may further contain at least one type of powder selected from the group consisting of $Sc_2O_3$ powder, $Tm_2O_3$ powder and $Y_2O_3$ powder as necessary. The above-described powdered raw material can be obtained by, for example, wet-mixing the $Tb_4O_7$ powder, $Al_2O_3$ powder and $Lu_2O_3$ powder and then drying.

The blending ratio of the $Tb_4O_7$ powder, $Al_2O_3$ powder and $Lu_2O_3$ powder in the powdered raw material is determined based on the composition of the single crystal to be grown. The blending ratio of the $Tb_4O_7$ powder, $Al_2O_3$ powder and $Lu_2O_3$ powder at this time may be as indicated below, for example.

Namely, the blending ratio of the $Tb_4O_7$ powder is normally 18 mol % to 30 mol % based on the number of moles of the powdered raw material (100 mol %).

The blending ratio of the $Al_2O_3$ powder is normally 35 mol % to 55 mol % based on the number of moles of the powdered raw material.

The blending ratio of the $Lu_2O_3$ powder is normally greater than 0 mol % and equal to or less than 10 mol % based on the number of moles of the powdered raw material.

Furthermore, in the case $Sc_2O_3$ powder, $Tm_2O_3$ powder and $Y_2O_3$ powder are contained in the powdered raw material, the blending ratios of the $Sc_2O_3$ powder, $Tm_2O_3$ powder and $Y_2O_3$ powder in the powdered raw material may be normally as indicated below.

Namely, the blending ratio of the $Sc_2O_3$ powder is normally 0 mol % to 35 mol % based on the number of moles of the powdered raw material.

The blending ratio of the $Tm_2O_3$ powder is normally 0 mol % to 10 mol % based on the number of moles of the powdered raw material.

The blending ratio of the $Y_2O_3$ powder is normally 0 mol % to 35 mol % based on the number of moles of the powdered raw material.

Furthermore, in the case the powdered raw material contains $Sc_2O_3$ powder, the $Lu_2O_3$ powder is preferably blended so as to be within the range of 0.5 mol % to 30 mol % to the total number of moles of the $Sc_2O_3$ powder and the $Lu_2O_3$ powder. In this case, a crystal of higher quality can be obtained. In particular, the $Lu_2O_3$ powder is more preferably blended so as to be within the range of 2.5 mol % to 10 mol % to the total number of moles of the $Sc_2O_3$ powder and the $Lu_2O_3$ powder. In this case, both controllability of crystal shape and crystallinity are favorable, and a crystal that is transparent overall is obtained. In other words, the overall crystal is more resistance to the occurrence of cracking as compared with the case of blending the $Lu_2O_3$ powder at a ratio of less than 2.5 mol % to the total number of moles of the $Sc_2O_3$ powder and the $Lu_2O_3$ powder. On the other hand, crystal shape becomes more uniform, variations in diameter are less and a more transparent crystal is obtained as compared with the case of blending the $Lu_2O_3$ powder at a ratio in excess of 10 mol % to the total number of moles of the $Sc_2O_3$ powder and the $Lu_2O_3$ powder. Furthermore, the term "mol %" referred to here indicates the ratio of the number of atoms of Lu to the total number of atoms of Sc and Lu.

After having packed the powdered raw material into the crucible 21, current is applied to the high-frequency coil 23. Then, the crucible 21 is heated and the powdered raw material in the crucible 21 is heated from room temperature to a prescribed temperature. Here, a prescribed temperature refers to the temperature at which the powdered raw material can be melted. The powdered raw material is then melted in this manner to obtain a melt 28. Next, the melt 28 is grown by a melt growth method. More specifically, a rod-shaped crystal pulling shaft, namely the seed crystal 29, is prepared. After immersing the end of the seed crystal 29 in the melt 28, the seed crystal 29 is pulled up at a prescribed pulling speed while being rotated at a prescribed rotating speed.

At this time, a garnet-based single crystal such as a yttrium-aluminum-garnet (YAG) single crystal is used for the seed crystal 29.

The rotating speed of the seed crystal 29 is preferably 3 rpm to 50 rpm and more preferably 3 rpm to 10 rpm.

The pulling speed of the seed crystal 29 is preferably 0.1 mm/h to 3 mm/h and more preferably 0.5 mm/h to 1.5 mm/h.

Pulling of the seed crystal 29 is preferably carried out in an inert gas atmosphere. A gas such as Ar or nitrogen gas can be used for the inert gas. In order to place the seed crystal 29 in an inert gas atmosphere, the inert gas may be evacuated while being introduced at a prescribed flow rate into the sealed housing 24.

When the seed crystal 29 is pulled in this manner, a bulk grown crystal 30 represented by the above-mentioned chemical formula (I) can be obtained on the end of the seed crystal 29. At this time, if the grown crystal 30 is composed of a terbium aluminum garnet-based single crystal and mainly a portion of the Al is replaced with Lu, the grown crystal 30 can be fabricated easily and enlargement of the grown crystal 30 can be realized.

Next, a detailed explanation is provided of the optical processor of the present invention while referring to FIG. 3. In FIG. 3, the same reference numerals are used to indicate those constituents that are the same as or equivalent to those of FIG. 1, and duplicate explanations thereof are omitted.

FIG. 3 is a schematic diagram showing one embodiment of an optical processor of the present invention. As shown in FIG. 3, an optical processor 100 is provided with a laser light source 11, and an optical isolator 10 arranged in a light path P of laser light L emitted from the laser light source 11. According to this optical processor 100, the laser light L emitted from the laser light source 11 is emitted through the optical isolator 10, and a workpiece Q can be processed by the emitted light.

Here, the single crystal used in the optical isolator 10 is provided with a Faraday rotation angle exceeding that of TGG single crystal in a wavelength region of 1064 nm or longer and is able to realize adequate enlargement as previously described.

Thus, a Nd:YAG laser having an emission wavelength of 1064 nm or a Yb-doped fiber laser having an emission wavelength of 1080 nm is preferably used for the laser light source 11.

Furthermore, the single crystal used in the optical isolator 10 demonstrates a Faraday rotation angle exceeding that of TGG single crystal even in a short wavelength region (400 nm to 700 nm). Consequently, in the case of using this single crystal, a laser light source having an emission wavelength of 400 nm to 700 nm can also be used for the laser light source 11. Examples of such a laser light source 11 include a GaN-based semiconductor laser having an emission wavelength of 405 nm and a titanium sapphire laser having an emission wavelength of 700 nm. Furthermore, according to the optical processor 100 provided with the laser light source 11 having an emission wavelength in a short wavelength region in this manner, since a cross-sectional portion of the workpiece Q is not subjected to damage by heat, a smooth cross-sectional surface can be obtained. In addition, unlike the case of a TGG single crystal, the above-mentioned single crystal is able to adequately inhibit decreases in transmittance even in a short wavelength region (400 nm to 700 nm). Consequently, decreases in output attributable to the optical isolator 10 are adequately prevented even if the emission wavelength of the laser light source 11 in the optical processor 100 is from 400 nm to 700 nm.

The present invention is not limited to the embodiments described above. For example, although wavelengths of 1064 nm or longer or 400 nm to 700 nm are listed as examples of the emission wavelength of the laser light source 11 in the above-mentioned embodiments, the present invention is not limited thereto. The emission wavelength of the laser light source may also be within the range of 700 nm to 1064 nm, such as in the vicinity of 800 nm or from 1030 nm to 1080 nm.

In addition, although the single crystal is used in an optical isolator of an optical processor in the above-mentioned embodiments, use of the single crystal is not limited to an optical isolator, but rather can also be applied to, for example, an optical magnetic field sensor that monitors changes in a magnetic field by measuring changes in Faraday rotation angle using a Faraday rotator.

EXAMPLES

Although the following provides a more detailed explanation of the contents of the present invention by indicating examples thereof, the present invention is not limited to the following examples.

Example 1

First, a terbium oxide ($Tb_4O_7$) raw material powder having a purity of 99.99%, an aluminum oxide ($Al_2O_3$) raw material powder having a purity of 99.99%, a scandium oxide ($Sc_2O_3$) raw material powder having a purity of 99.99% and a lutetium oxide ($Lu_2O_3$) raw material powder having a purity of 99.99% were prepared.

A mixed powder was then obtained by wet-mixing the raw material powders. At this time, the $Lu_2O_3$ raw material powder was made to be contained at a ratio of 2.5 mol % based on the total number of moles (100 mol %) of the $Sc_2O_3$ raw material powder and the $Lu_2O_3$ raw material powder. Next, the mixed powder was dried and put in an Ir crucible as the final raw material (powdered raw material). The shape of the crucible was cylindrical, the diameter was about 60 mm, and the height was about 60 mm.

A melt was then obtained by melting the powdered raw material by heating from room temperature to 1950° C. Next, the end of a seed crystal having the shape of a square bar and composed of YAG (yttrium aluminum garnet) and measuring 3 mm×3 mm×70 mm was placed in the melt, and the seed crystal was pulled at a speed of 1 mm per hour while rotating at a rotating speed of 10 rpm to grow a bulk crystal. A transparent single crystal (Crystal A) having a diameter of about 2.5 cm and length of about 12 cm was obtained in this manner.

At this time, crystal growth was carried out in an Ar gas atmosphere, and the flow rate of the Ar gas was $3.3\times10^{-5}$ $m^3/s$.

When X-ray diffraction was carried out on the resulting Crystal A, a peak was confirmed for $Tb_3Al_5O_{12}$. In addition, as a result of carrying out structural analysis on the resulting Crystal A by X-ray diffraction and electron spin resonance (EPR), a portion of the Al was confirmed to be replaced with Sc and Lu, and a portion of the Tb was confirmed to be replaced with Sc.

Moreover, the composition of the single crystal (atomic ratio of Tb, Sc, Al, Lu and O) was confirmed by carrying out chemical analysis on the Crystal A by ICP (inductively coupled plasma). Specifically, chemical analysis by ICP was carried out in the manner described below. Namely, 50 mg were first cut out from the lower end of the straight portion of the Crystal A to obtain a cutout section. Next, the cutout section was placed in a platinum crucible followed by adding 250 mg of lithium tetraborate. Next, the platinum crucible was placed in a high-temperature heating oven and heated for 2 hours at 1030° C. to melt the cutout section. Subsequently, after allowing the platinum crucible to cool on standing, the cutout section was placed in a 50 ml beaker followed by the addition of 20 ml of HCl. Next, the beaker was arranged on a hot plate and heated gently to dissolve each of the elemental components (Tb, Sc, Al and Lu) in the HCl from the cutout section. At this time, the solution that resulted in the beaker was measured to a volume of 50 ml, and chemical analysis by ICP was carried out on that solution. As a result, the single crystal was confirmed to have a composition represented by the following formula:

$(Tb_{2.97}Sc_{0.02})(Sc_{1.94}Lu_{0.05})Al_{2.97}O_{12}$ (x=0.05, y=0.02, z=0.03, a=2.99, b=1.99).

Example 2

A transparent single crystal (Crystal C) having a diameter of about 2.5 cm and length of about 12 cm was obtained in the same manner as Example 1 with the exception of containing the $Lu_2O_3$ raw material at a ratio of 5 mol % based on the total number of moles of the $Sc_2O_3$ raw material powder and the $Lu_2O_3$ raw material powder when obtaining the mixed powder.

When X-ray diffraction was carried out on the resulting Crystal C, a peak was confirmed for $Tb_3Al_5O_{12}$. In addition, as a result of carrying out structural analysis on the resulting Crystal C by X-ray diffraction and EPR, a portion of the Al was confirmed to be replaced with Sc and Lu, and a portion of the Tb was confirmed to be replaced with Sc.

Moreover, chemical analysis was carried out on the Crystal C by ICP (inductively coupled plasma) in the same manner as Example 1. As a result, a single crystal was confirmed to have been obtained that had a composition represented by the following formula:

$(Tb_{2.96}Sc_{0.06})(Sc_{1.91}Lu_{0.13})Al_{2.95}O_{12}$ (x=0.13, y=0.06, z=0.05, a=3.02, b=2.04).

Example 3

A transparent single crystal (Crystal E) having a diameter of about 2.5 cm and length of about 12 cm was obtained in the same manner as Example 1 with the exception of containing the $Lu_2O_3$ raw material powder at a ratio of 10 mol % based on the total number of moles of the $Sc_2O_3$ raw material powder and the $Lu_2O_3$ raw material powder when obtaining the mixed powder.

When X-ray diffraction was carried out on the resulting Crystal E, a peak was confirmed for $Tb_3Al_5O_{12}$. In addition, as a result of carrying out structural analysis on the resulting Crystal E by X-ray diffraction and EPR, a portion of the Al was confirmed to be replaced with Sc and Lu, and a portion of the Tb was confirmed to be replaced with Sc.

Moreover, chemical analysis was carried out on the Crystal E by ICP (inductively coupled plasma) in the same manner as Example 1. As a result, a single crystal was confirmed to have been obtained that had a composition represented by the following formula:

$(Tb_{2.95}Sc_{0.09})(Sc_{1.85}Lu_{0.21})Al_{2.98}O_{12}$ (x=0.21, y=0.09, z=0.02, a=3.04, b=2.06).

Comparative Example 1

$Tb_3Ga_5O_{12}$ (TGG) manufactured by Fujian Castech Crystals Inc. was used as a comparative example.

[Evaluation of Properties]
(Faraday Rotation Angle)

Faraday rotation angles were measured for the single crystals of Examples 1 to 3 obtained as described above as well as Comparative Example 1 at wavelengths of 633 nm, 1064 nm and 1303 nm.

At this time, Faraday rotation angles were measured in the manner described below. Namely, an analyzer was first rotated without arranging a single crystal between a polarizer and the analyzer to create a quenched state. Next, the single crystals of Examples 1 to 3 and Comparative Example 1 were cut out into the shape of a square bar measuring 3.5 mm wide×3.5 mm high×12 mm long, each of the single crystals was arranged between the polarizer and the analyzer, light was allowed to enter the single crystal along the longitudinal direction thereof while applying a magnetic flux density of 0.42 T, and the analyzer was again rotated to create a quenched state. The difference between the rotation angle of the analyzer before placing the single crystal between the polarizer and the analyzer and the rotation angle of the analyzer after having placed the single crystal between the polarizer and the analyzer was then calculated, and that angle difference was taken to be the Faraday rotation angle. At this time, the Faraday rotation angle was respectively measured at wavelengths of 633 nm, 1064 nm and 1303 nm. Faraday rotation angle ratios were then calculated based on the measured Faraday rotation angles. Here, the Faraday rotation angle ratio was calculated according to the following formula based on the Faraday rotation angle of each example and the Faraday rotation angle of TGG.

Faraday rotation angle ratio=Faraday rotation angle of single crystal targeted for calculation of Faraday rotation angle ratio/Faraday rotation angle of TGG.

Figure 5:
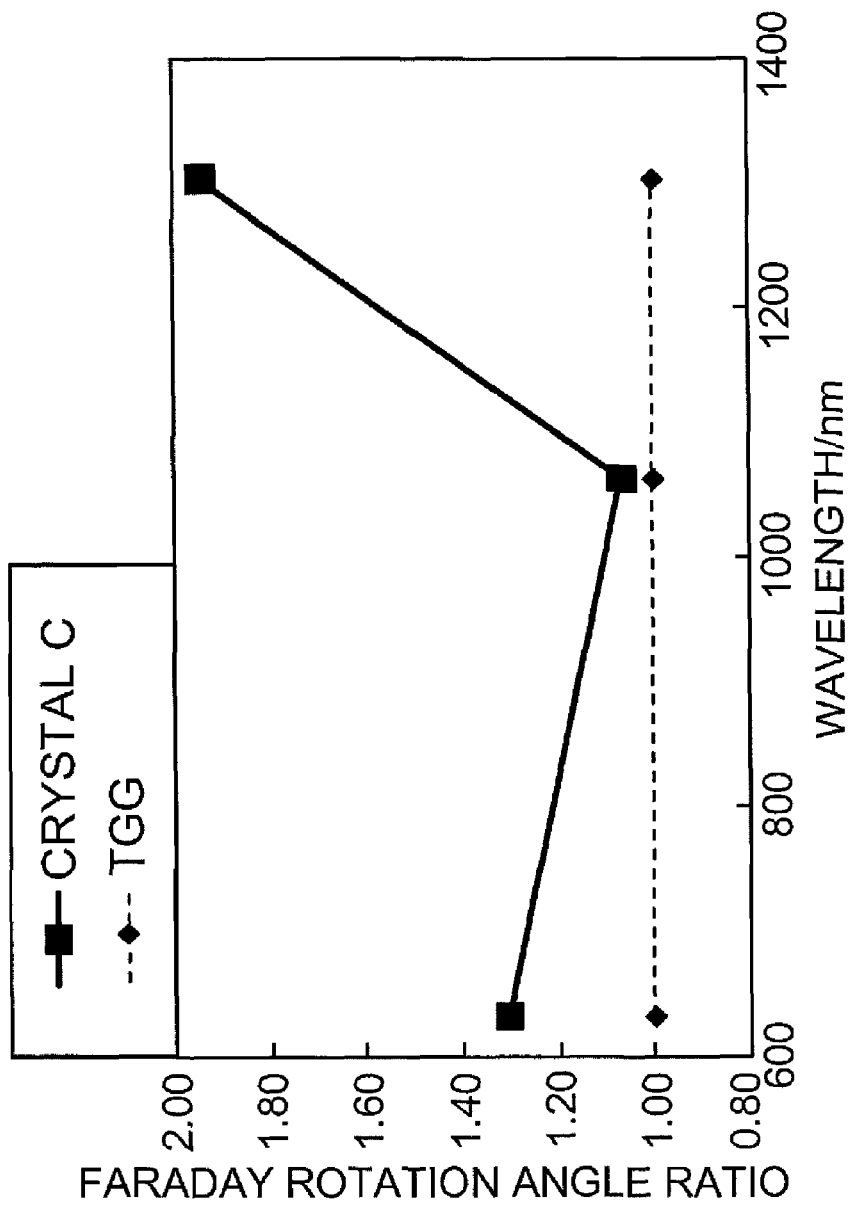
FIG. 5 is a graph indicating the relationship between the ratio of the Faraday rotation angle of a single crystal of Example 2 (Crystal C) to that of TGG and wavelength.

Here, values at the same wavelength were used for the Faraday rotation angle of TGG and the Faraday rotation angles of the single crystals targeted for calculation of Faraday rotation angle ratio. The results are shown in FIGS. 4 to 6. FIGS. 4 to 6 are graphs respectively indicating the relationship between Faraday rotation angle ratios of the single crystals of Examples 1 to 3 and wavelength. In FIGS. 4 to 6, the relationships between Faraday rotation angle ratio and wavelength for the single crystals of Examples 1 to 3 are indicated with solid lines, while the relationships between the Faraday rotation angle ratio (=1) and wavelength for TGG of Comparative Example 1 are indicated with broken lines.

(Transmittance)

Figure 7:
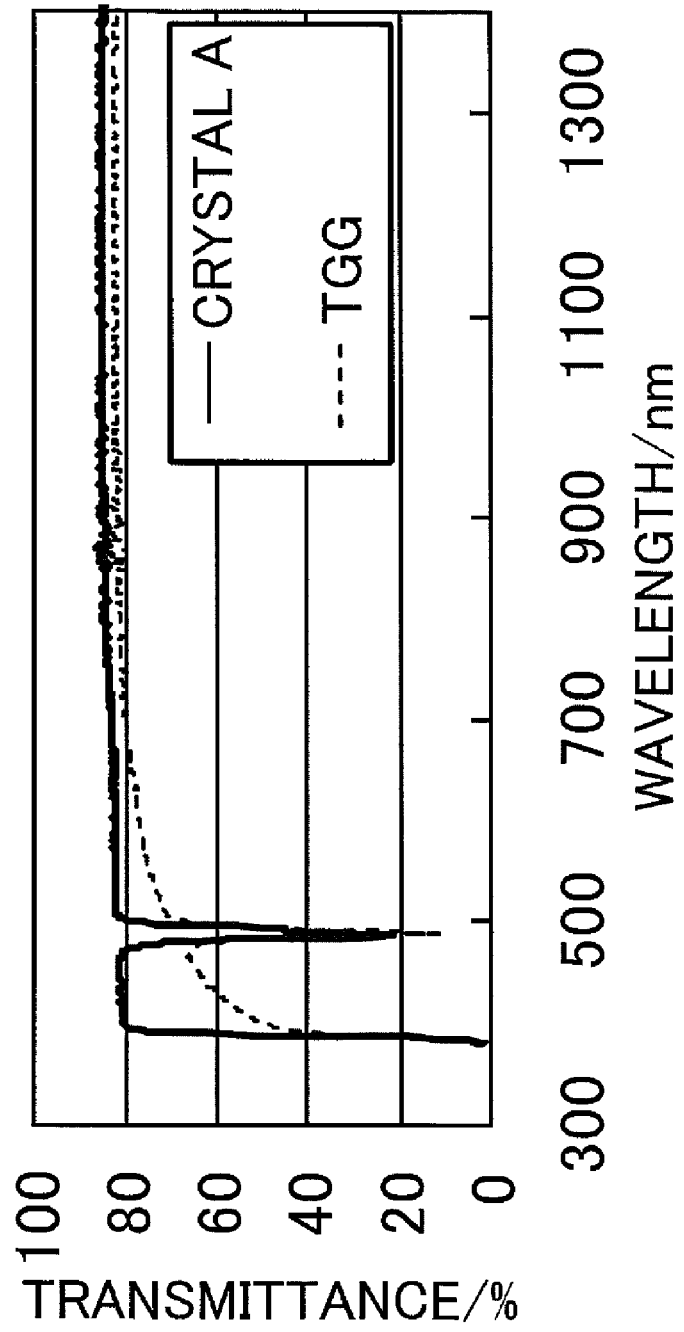
FIG. 7 is a graph indicating the relationship between transmittance and wavelength for a single crystal of Example 1 (Crystal A)
Figure 8:
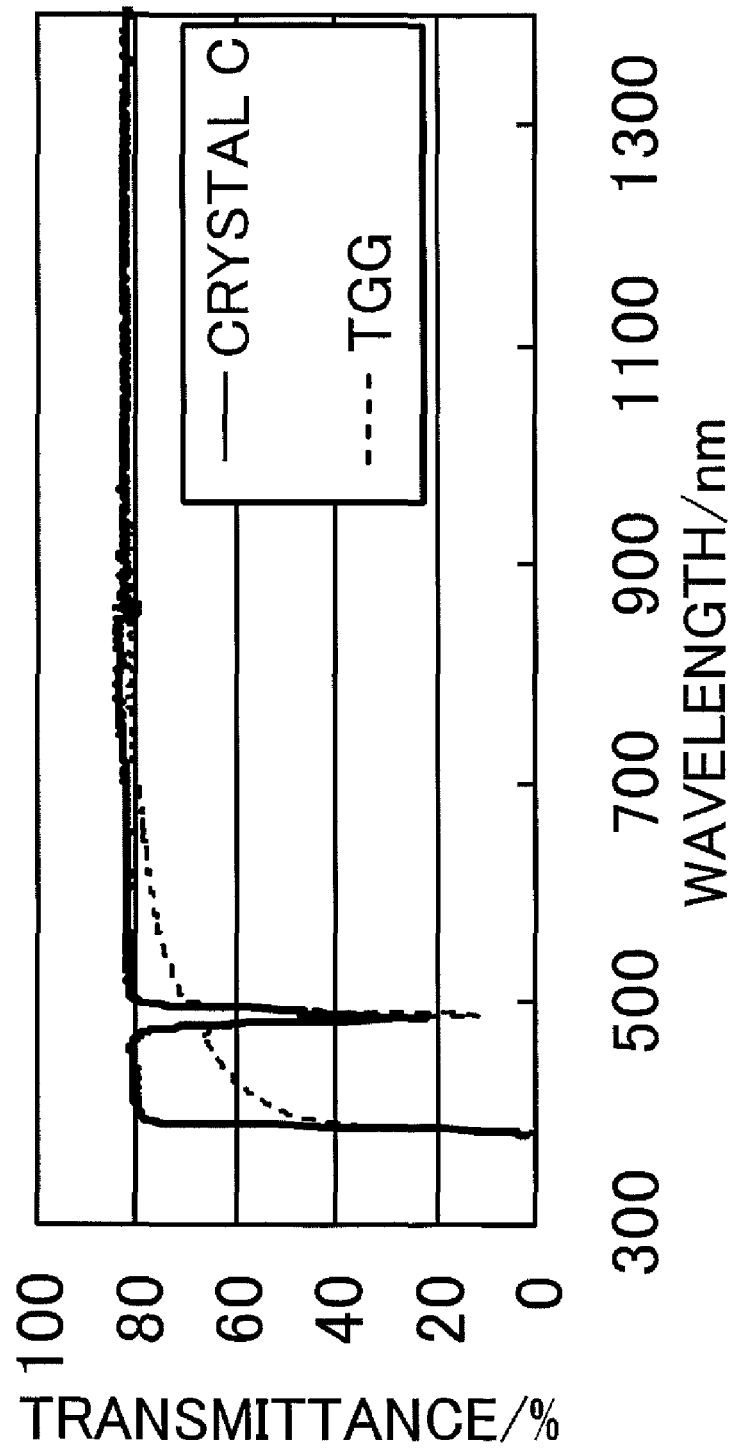
FIG. 8 is a graph indicating the relationship between transmittance and wavelength for a single crystal of Example 2 (Crystal C)
Figure 9:
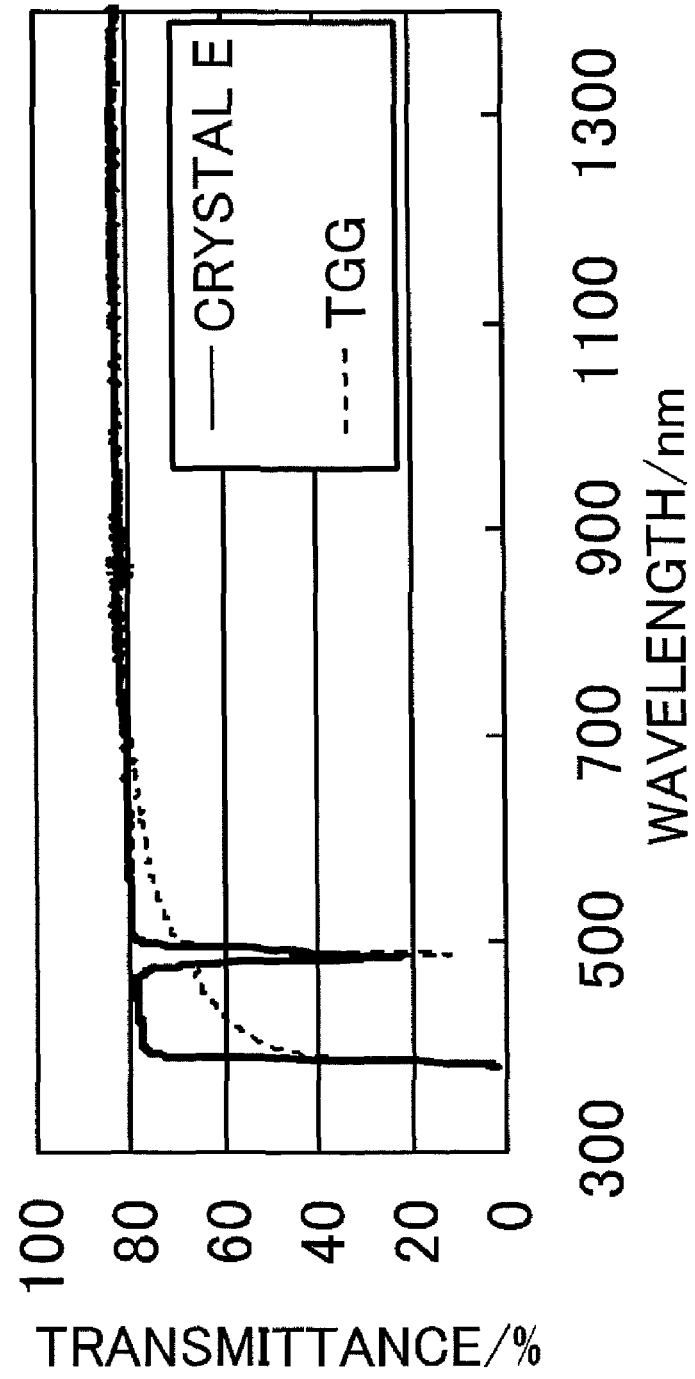
FIG. 9 is a graph indicating the relationship between transmittance and wavelength for a single crystal of Example 3 (Crystal E).

The single crystals of Examples 1 to 3 obtained in the manner previously described as well as Comparative Example 1 were cut out into the shape of a square bar measuring 3.5 mm wide×3.5 mm high×12 mm long, and transmittance was measured for the resulting cutout crystals over a wide wavelength region (200 nm to 1400 nm). The results are shown in FIGS. 7 to 9. FIGS. 7 to 9 are graphs respectively indicating the relationship between transmittance and wavelength, or in other words the transmission spectra, of the single crystals of Examples 1 to 3. FIGS. 7 to 9 also respectively indicate the results for the transmission spectra for TGG of Comparative Example 1. Furthermore, in FIGS. 7 to 9, the transmission spectra of Examples 1 to 3 are indicated with solid lines, while those of Comparative Example 1 are indicated with broken lines.

The following findings were able to be clearly determined from the results of FIGS. 4 to 9.

(1) The single crystals of Examples 1 to 3, which are composed of terbium aluminum garnet single crystals and in which a portion of the Al is replaced with Lu, had larger Faraday rotation angles than TGG at each of the three wavelengths used for evaluation.

(2) All of the single crystals of Examples 1 to 3 had transmittance equal to or greater than that of TGG over nearly the entire wavelength region. In the wavelength region of 400 nm to 700 nm in particular, the transmittance of Comparative Example 1 (TGG) decreased rapidly as the wavelength became shorter. By contrast, transmittance values of the same level were observed at both wavelengths of 400 nm and 700 nm for the single crystals of Examples 1 to 3. Namely, in the optical isolators of Examples 1 to 3, high transmittance was maintained over the range of 400 nm to 700 nm.

(3) Large, transparent single crystals measuring about 2.5 cm in diameter and about 12 cm in length were able to be obtained for each of the single crystals of Examples 1 to 3.

On the basis of the above results, a terbium aluminum garnet single crystal in which a portion of the Al has been replaced with Lu allows the obtaining of a Faraday rotation angle exceeding that of TGG at a wavelength of 1064 nm or in a longer wavelength region. For this reason, the present invention is preferable as a single crystal for an optical isolator of an optical processor that uses an Nd:YAG laser. Moreover, the single crystal of the present invention can provide with a Faraday rotation angle exceeding that of TGG single crystal even in a short wavelength region (400 nm to 700 nm) and inhibit decreases in transmittance adequately. Thus, according to the single crystal of the present invention, a Faraday rotation angle can be obtained that is higher than that of TGG over a wide wavelength region. Accordingly, the single crystal of the present invention has extremely high versatility.

In addition, the single crystal according to the present invention is able to realize adequate enlargement. Consequently, a large number of single crystals can be cut out from the resulting single crystal, thereby making it possible to reduce the price of optical isolators.

Moreover, the single crystal according to the present invention retains transmittance that is higher than that of TGG even in a short wavelength region (400 nm to 700 nm) as well as in a long wavelength region (1064 nm or longer), and has a Faraday rotation angle that is also larger than that of TGG. For this reason, the single crystal according to the present invention is able to function as an optical isolator that is superior to that of TGG even in a short wavelength region (400 nm to 700 nm), and is therefore able to effectively function as an optical isolator for short-wavelength lasers.

INDUSTRIAL APPLICABILITY

The single crystal of the present invention is effective as a single crystal for an optical isolator both in a long wavelength region of 1064 nm or longer as well as in a wavelength region consisting of wavelengths of shorter than 1064 nm. Namely, although the single crystal of the present invention is mainly preferable for long wavelength region applications such as wavelengths of 1064 nm or longer, it can also be applied to broad band applications in the vicinity of 800 nm, high power applications of 1030 nm to 1080 nm as well as short wavelength applications of 400 nm to 700 nm.

The present invention can also be applied to, for example, an optical magnetic field sensor that monitors changes in a magnetic field by measuring changes in Faraday rotation angle using a Faraday rotator.

EXPLANATION OF REFERENCE NUMERALS

10 Optical isolator
11 Laser light source
20 Crystal pulling oven
21 Iridium crucible
22A Inner heat insulating material
22B Outer heat insulating material
23 High-frequency coil
28 Melt
29 Crystal pulling shaft
30 Grown crystal
100 Optical processor

The invention claimed is:

1. A single crystal which is composed of a terbium aluminum garnet single crystal and in which a portion of the aluminum is replaced with lutetium (Lu).

2. The single crystal according to claim 1, represented by the following chemical formula:

$$(Tb_{a-y}L_y)(M_{b-x}N_x)Al_3-zO_{12} \quad (I)$$

(wherein, L represents M or N, M represents at least one type of element selected from the group consisting of Sc and Y, N contains Lu, and a and b satisfy the following formulas:

$0.01 \le x \le 0.6;$ $0 \le y \le 0.5;$ $-0.5 \le z \le 0.5;$ $2.8 \le a \le 3.2;$ and $1.8 \le b \le 2.2.$ 3. The single crystal according to claim 1, wherein N in the chemical formula is Lu.

4. The single crystal according to claim 1, wherein N in the chemical formula further contains at least one type of element selected from the group consisting of Yb and Tm.

5. The single crystal according to claim 1, wherein y and z in the chemical formula satisfy the following formulas:

$0 \leq y \leq 0.2$; and $-0.2 \leq z \leq 0.2$.

6. The single crystal according to claim 1, wherein y is 0.

7. A production process of a single crystal, comprising:
heating and melting a powdered raw material containing terbium oxide, aluminum oxide and lutetium oxide; and
obtaining the single crystal according to claim 1 from a resulting melt by a melt growth method.

8. An optical isolator having the single crystal according to claim 1.

9. An optical processor comprising:
a laser light source; and
an optical isolator arranged in a light path of laser light emitted from the laser light source,
wherein the optical isolator is the optical isolator according to claim 8.

10. The optical processor according to claim 8, wherein an emission wavelength of the laser light source is 1064 nm.

11. The optical processor according to claim 9, wherein an emission wavelength of the laser light source is 400 nm to 700 nm.

* * * * *